United States Patent
Hsu et al.

(10) Patent No.: US 6,759,276 B1
(45) Date of Patent: Jul. 6, 2004

(54) MATERIAL TO IMPROVE CMOS IMAGE SENSOR YIELD DURING WAFER SAWING

(75) Inventors: Hung-Jen Hsu, Taoyuan (TW); Yu-Kung Hsiao, Tao-Yuan (TW); Chih-Kung Chang, Hsin-chu (TW); Sheng-Liang Pan, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 6 days.

(21) Appl. No.: 10/209,149

(22) Filed: Jul. 30, 2002

(51) Int. Cl.[7] .............................................. H01L 21/44
(52) U.S. Cl. ...................... 438/114; 438/460; 438/464
(58) Field of Search .............................. 438/14, 33, 68, 438/113, 460, 464, 465

(56) References Cited

U.S. PATENT DOCUMENTS

| | | | |
|---|---|---|---|
| 5,516,728 A | * 5/1996 | Degani et al. | 438/465 |
| 5,641,714 A | 6/1997 | Yamanaka | 438/14 |
| 5,840,614 A | 11/1998 | Sim et al. | 438/464 |
| 5,981,361 A | 11/1999 | Yamada | 438/464 |
| 6,074,896 A | 6/2000 | Dando | 438/114 |
| 6,271,103 B1 | 8/2001 | Lee | 438/464 |
| 6,335,224 B1 | * 1/2002 | Peterson et al. | 438/11 |

* cited by examiner

*Primary Examiner*—Dung A. Le
(74) *Attorney, Agent, or Firm*—George O. Saile; Stephen B. Ackerman

(57) ABSTRACT

A new method is provided of treating the wafer prior to the process of singulating the wafer into individual die. A surface of the wafer over which CMOS image sensor devices have been created is coated with a layer of material that is non-soluble in water. The wafer is singulated by sawing through the layer of material that has been coated over the surface of the wafer and by then sawing through the wafer. The singulated die is then further processed by applying steps of die mount, wire bonding, surrounding the die in a mold compound and marking the package.

7 Claims, 3 Drawing Sheets

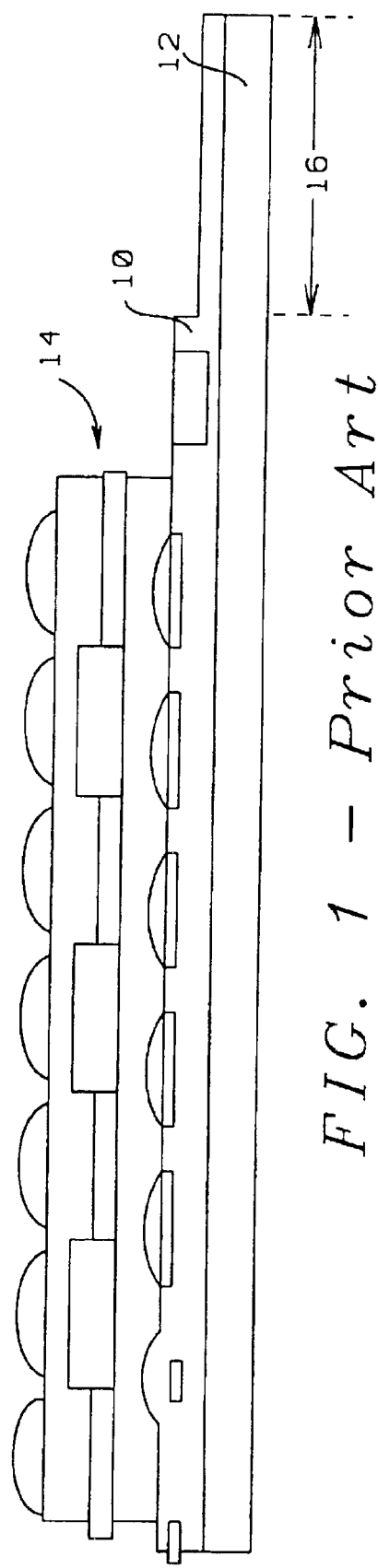
FIG. 1 – Prior Art
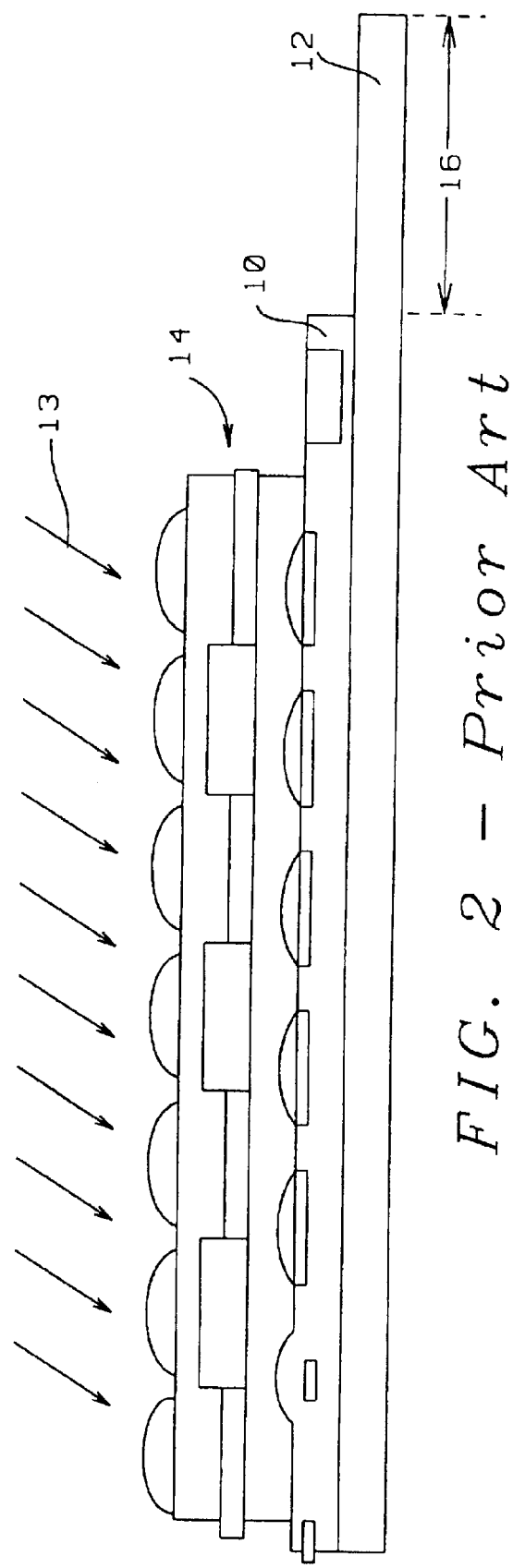
FIG. 2 – Prior Art

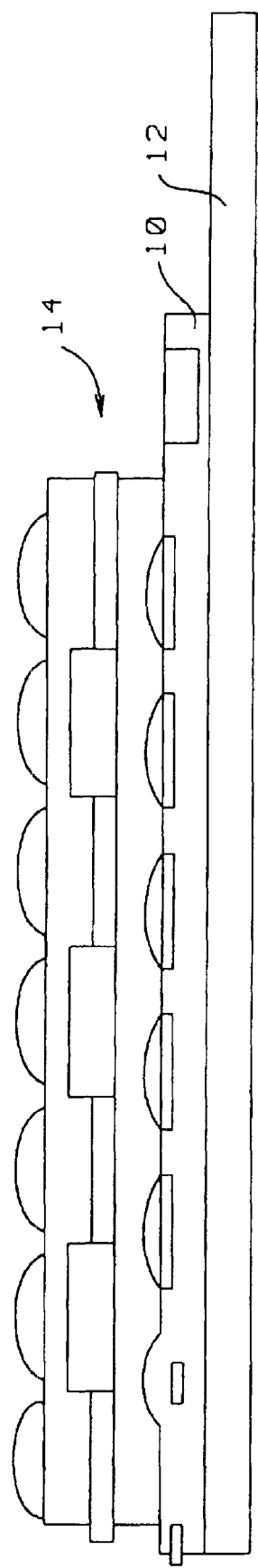

MATERIAL TO IMPROVE CMOS IMAGE SENSOR YIELD DURING WAFER SAWING

BACKGROUND OF THE INVENTION (1) Field of the Invention

The invention relates to the fabrication of integrated circuit devices, and more particularly, to a method of separating created CMOS sensor image devices in such a way that foreign particles created as byproducts of the sawing operation do not contribute to yield loss of the separated devices.

(2) Description of the Prior Art

The art of creating CMOS base image sensor devices is well known and is in addition highlighted in considerable detail in the below referenced and related US Patents. Since this art does only indirectly apply to the invention and in view of the available literature on the subject of CMOS image sensor devices, no effort will be made at this time to provide further insight into the subject of creating CMOS image sensor devices.

CMOS image sensor devices are typically, like the majority of semiconductor devices that are created in a high volume and cost-effective manufacturing operation, created as multiple devices over the surface of one substrate. After the creation of these devices has been completed, the devices must be separated or singulated for further packaging of the devices. This process of singulation into individual chips is typically performed by sawing the wafer over the surface of which the devices have been created along scribe lines that have been provided over the surface of the substrate for this purpose. This process of sawing creates as a byproduct matter that is removed as a result of the sawing, which is essentially silicon based since it is the silicon substrate that is significantly affected by the sawing process.

The created byproduct of the sawing operation is not under control as far as distribution and scattering of this material is concerned. This leads to the creation of depositions of this byproduct not only where it is not desired but also where in addition it can have a severely negative impact on final product performance and acceptance. In short: the process of chip singulation by sawing of the wafer readily results in causing otherwise good chips to be contaminated with byproducts of the sawing process, which is a ready cause of final product failure. The invention addresses this concern and provides a method whereby a negative yield impact caused by byproducts of a singulation operation is eliminated.

U.S. Pat. No. 6,271,103 B1 (Lee) shows an UV Tape and die saw process for an image sensor.

U.S. Pat. No. 5,981,361 (Yamada) shows a dicing process.

U.S. Pat. No. 5,840,614 (Sim et al.) reveals a process using UV tape and lapping and sawing.

U.S. Pat. No. 5,641,714 (Yamanaka) discloses a process with tape.

U.S. Pat. No. 6,074,896 (Dando) shows a sawing process involving tape.

SUMMARY OF THE INVENTION

A principle objective of the invention is to provide a method of singulating CMOS image sensor devices from a wafer over the surface of which these devices have been created.

Another objective of the invention is to eliminate the process of die singulation as a device yield detractor.

Yet another objective of the invention is to provide a method of controlling byproducts that are created during the processes of singulating die from a wafer.

A new method is provided of treating the wafer prior to the process of singulating the wafer into individual die. A surface of the wafer over which CMOS image sensor devices have been created is coated with a layer of material that is non-soluble in water. The wafer is singulated by sawing through the layer of material that has been coated over the surface of the wafer and by then sawing through the wafer. The singulated die is then further processed by applying steps of die mount, wire bonding, surrounding the die in a mold compound and marking the package.

BRIEF DESCRIPTION OF THE DRAWINGS

FIGS. 1 and 2 show conventional processes of singulating a water over the surface of which CMOS image sensor devices have been created.

FIG. 5 shows a cross section after the layer of material, which is not soluble in water, has been removed from the active surface of the substrate.

DESCRIPTION OF THE PREFERRED EMBODIMENTS

Figure 3:
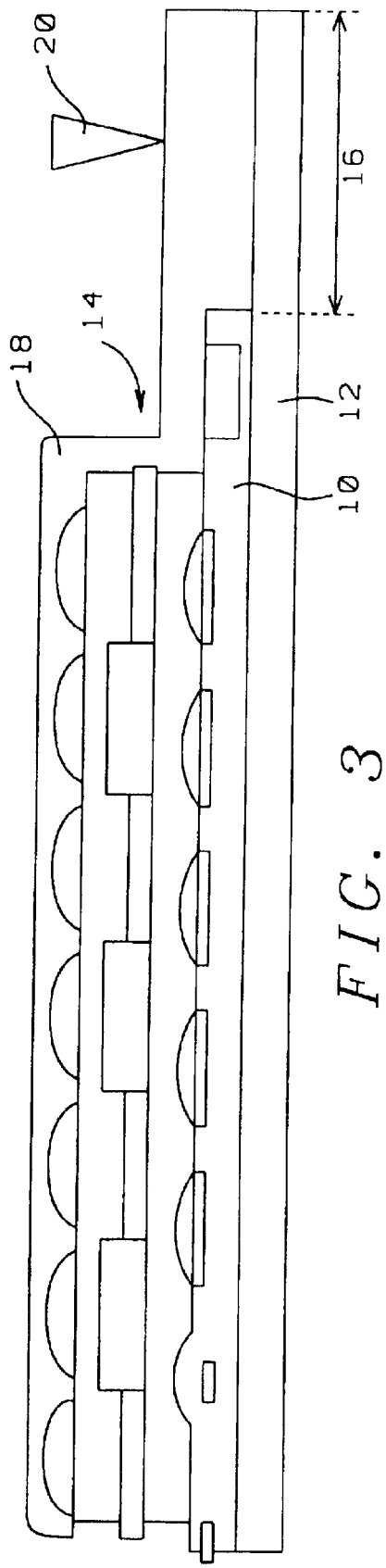
FIG. 3 shows a cross section of a substrate over the surface of which CMOS image sensor devices have been created, a layer of material, which is not soluble in water, has been deposited over the active surface of the substrate.

Conventional processing steps of creating CMOS image sensor devices typically have a yield of between about 70 and 80%. CMOS image sensor devices are, due to the nature and the therefrom following construction of the devices, highly sensitive to any foreign particles or contaminants that may come in contact with or accumulate over exposed surfaces of the devices before these devices are finally packaged and enclosed.

In creating CMOS image sensor devices, the step of singulating the created devices into individual chips is a step that significantly and detrimentally introduces a large amount of foreign particles into the environment that surrounds the devices during and immediately after these devices are singulated. This is due to the fact that singulation is performed by sawing the wafer over the surface of which the CMOS image devices have been created, creating as a byproduct particles of mostly silicon derived from the silicon substrate. The process of singulating the wafer into individual CMOS image sensor devices has been identified as causing a yield loss of between about 15% and 20%.

The current methods of singulating a wafer over the surface or which CMOS image devices have been created comprises the steps of:

Applying a backside blue tape to the wafer

Sawing the wafer into individual die, leaving the sawed die attached to the tape Applying a water rinse to the surface of the sawed die Removing the sawed die from the tape, and Packaging the singulated die.

This prior art process has been further highlighted with the cross sections shown in FIGS. 1 and 2, wherein specifically are highlighted:

10, the substrate over the surface of which CMOS image sensor devices have been created 12, the blue tape that is attached to a second surface of substrate 10

14, the multiple CMOS image sensor devices that have been created over a first or active surface of substrate 10, and 16, the saw path that will be used for the singulation of the wafer into individual die.

FIG. 2 shows a prior art cross section after the process of sawing the wafer 10 has been completed in accordance with the saw path 16, FIG. 1. The singulated die 14 is as yet attached to the blue tape 12.

At this time, that is after the cross section of FIG. 2 has been obtained, a water rinse 13 is applied to the surface of the singulated die after which the die 14 is removed from tape 12 for further packaging.

The conventional method of die singulation as highlighted above is changed as follows:

Applying a backside blue tape to the wafer

Next and most significantly to the invention, applying a protective layer of material that is not soluble in water over the active or first surface of the wafer, that is the surface over which CMOS image sensor devices have been created Sawing the wafer into individual die by, while approaching the wafer from the first or active side of the wafer, that is the side over which the protective layer has been applied:
1. sawing through the protective layer applied over the active or first surface of the wafer, and then
2. sawing through the silicon substrate, leaving the sawed die attached to the tape Applying a water rinse to the surface of the sawed die Removing the protective layer from the active surface of the wafer by cleaning the active surface of the wafer with a special chemical that removes the non-water soluble protective layer Removing the sawed die from the tape, and Packaging the singulated die.

Figure 4:
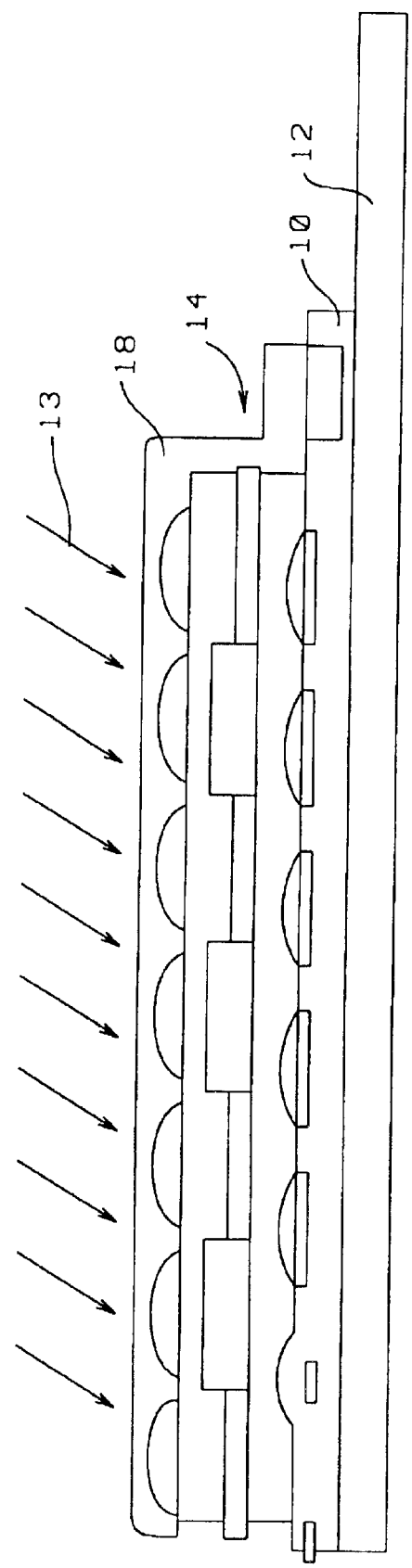
FIG. 4 shows a cross section after the wafer shown in cross section in FIG. 3 has been singulated down to the surface of the blue tape.

FIGS. 3 and 4 further highlight these processing steps, whereby specifically is shown in the cross section of FIG. 3 how a layer 18 of material that is not soluble in water is applied over the surface of the created CMOS image sensor devices 14, this after first the wafer has been attached to the blue tape 12. The die saw 20 is positioned above the saw path 16 for application to the surface of substrate 10 with the objective of cutting the wafer along the saw path 16. The result of this process of sawing substrate 10 is shown in the cross section of FIG. 4, where the protective layer 18 has first been removed in accordance with the saw path 16 after which the silicon of substrate 10 has been removed. Layer 18 has, during the processes of sawing the substrate 10, remained in place as a protective layer for and overlying the CMOS image devices 14. No foreign particles can therefore be deposited over the surface of these CMOS image devices 14.

After the above highlighted sawing of protective layer 18 and wafer 10 has been completed, a water rinse 13, FIG. 4, is applied to the active surface of the wafer 10. The protective layer 18 is then removed from over the active surface of wafer 19.

The removal of the protective layer 18 results in the cross section that is shown in FIG. 5. From the sequence of cross section that have been shown in FIGS. 3 through 5, it is clear that the special layer 18, FIGS. 3 and 4, has protected the surface of the layer 14 of CMOS image sensor devices during the step of singulating the wafer into individual die.

After the layer 18 has been removed from above the active surface of the wafer, the singulated die 14 is removed from the tape 12 (not shown) and is now ready for further packaging operations such as die mount, wire bonding, surrounding the die in a mold compound and marking the package.

To summarize the invention:

A new sequence of steps is provided for the singulation of a wafer over the surface of which multiple CMOS image sensor devices have been created The new sequence of processing steps that is provided by the invention comprises
1. first applying a special, protective layer over the first, active surface of the wafer, this layer may not be water soluble
2. applying a backside blue tape to a second surface of the wafer
3. sawing the wafer by first sawing through the protective layer and then sawing through the silicon of the wafer
4. applying a water rinse to the active surface of the sawed wafer
5. applying a wafer surface clean using a chemical cleaning agent that removes the special layer from the first surface of the wafer, and
6. removing the singulated die from the blue tape The singulated CMOS image sensor device die are then further packaged following conventional methods of device packaging.

While the examples that have been shown in the cross sections of FIG. 3 through 5 concentrate on the singulation of CMOS image sensor devices, it must be emphasized that the method of the invention of protecting the active surface of a substrate before this substrate is singulated is equally applicable for substrates over the surface of which semiconductor devices other than CMOS image sensor devices have been created. The concern of not creating a yield detractor due to the disbursement and accumulation of foreign matter over the surface of created semiconductor devices is universal and is not limited to where the created semiconductor devices are CMOS image sensor devices, even if this latter category of devices is most sensitive to the impact of foreign particles that are deposited over the surface thereof.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for singulation of die comprising CMOS image sensor devices from a semiconductor substrate, comprising the steps of:

providing a semiconductor substrate, said substrate having a first and a second surface, CMOS image sensor devices having been created over the first surface of said substrate;

covering the second surface of said substrate with a tape;

depositing a layer of non-water soluble material over the CMOS image sensor devices;

singulating said substrate by sawing, thereby approaching said substrate from said first surface of said substrate, thereby sawing said layer of non-water soluble material and said substrate along lines of substrate singulation, thereby creating singulated die comprising CMOS image sensor devices;

applying a water rinse to the first surface of said substrate;

removing said layer of non-water soluble material from over the first surface of said substrate; and removing said singulated die from said tape.

2. A method for the singulation of CMOS image sensor device die from a semiconductor substrate, comprising the steps of:

providing a semiconductor substrate, said substrate having a first and a second surface, CMOS image sensor devices having been created over the first surface of said substrate;

covering the second surface of said substrate with a tape;

depositing a layer of non-water soluble material over the CMOS image sensor devices created over the first surface of said substrate;

singulating said substrate by sawing, thereby approaching said substrate from said first surface of said substrate, thereby sawing said layer of non-water soluble material and said substrate along lines of substrate singulation, creating singulated CMOS image sensor device die;

applying a water rinse to the first surface of said substrate;

removing said layer of non-water soluble material from over the first surface of said substrate; and removing said singulated CMOS image sensor device die from said tape.

3. A method for singulation of die comprising CMOS image sensor devices from a semiconductor substrate, comprising the steps of:

providing a semiconductor substrate, said substrate having a first and a second surface, CMOS image sensor devices having been created over the first surface of said substrate;

providing a layer of protective material over the first surface of said substrate;

singulating said substrate into individual semiconductor die comprising CMOS image sensor devices by sawing said substrate;

rinsing the surface of said singulated semiconductor die by applying a water rinse to the surface thereof; and removing said layer of protective material from the surface of said singulated semiconductor die.

4. The method of claim 3, said protective material being non-soluble in water.

5. A method for the singulation of CMOS image sensor device die from a semiconductor substrate, comprising the steps of:

providing a semiconductor substrate, said substrate having a first and a second surface, CMOS image sensor devices having been created over the first surface of said substrate;

providing a layer of protective material over the first surface of said substrate;

singulating said substrate into individual semiconductor die by sawing said substrate, thereby creating singulated CMOS image sensor device die;

rinsing the surface of said singulated CMOS image sensor device die by applying a water rinse to the surface thereof; and removing said layer of protective material from the surface of said singulated CMOS image sensor device die.

6. The method of claim 5, said protective material being non-soluble in water.

7. A method for the singulation of CMOS image sensor device die from a semiconductor substrate, comprising the steps of:

providing a semiconductor substrate, said substrate having a first and a second surface, CMOS image sensor devices having been created over the first surface of said substrate;

providing a layer of non-water soluble protective material over the first surface of said substrate;

singulating said substrate into individual semiconductor die by sawing said substrate, thereby creating singulated CMOS image sensor device die;

rinsing the surface of said singulated CMOS image sensor device die by applying a water rinse to the surface thereof; and removing said layer of protective material from the surface of said singulated CMOS image sensor device die.

* * * * *